(12) United States Patent
Kumar et al.

(10) Patent No.: US 9,553,091 B1
(45) Date of Patent: Jan. 24, 2017

(54) SEMICONDUCTOR STRUCTURE AND METHOD FOR MANUFACTURING THE SAME

(71) Applicant: Vanguard International Semiconductor Corporation, Hsinchu (TW)

(72) Inventors: Manoj Kumar, Dhanband (IN); Chia-Hao Lee, New Taipei (TW); Chih-Cherng Liao, Jhudong Township (TW); Ching-Yi Hsu, Hsinchu (TW); Jun-Wei Chen, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/863,008

(22) Filed: Sep. 23, 2015

(51) Int. Cl.
*H01L 29/78* (2006.01)
*H01L 21/336* (2006.01)
*H01L 27/092* (2006.01)
*H01L 21/8238* (2006.01)

(52) U.S. Cl.
CPC ... *H01L 27/0922* (2013.01); *H01L 21/823807* (2013.01); *H01L 27/0928* (2013.01)

(58) Field of Classification Search
None
See application file for complete search history.

(56) References Cited

U.S. PATENT DOCUMENTS

| 6,969,901 B1* | 11/2005 | Pan | H01L 21/823418 257/371 |
| 2003/0001206 A1* | 1/2003 | Negoro | H01L 21/823857 257/336 |
| 2007/0132033 A1* | 6/2007 | Wu | H01L 21/823814 257/371 |
| 2008/0283915 A1* | 11/2008 | Jang | H01L 29/0653 257/344 |
| 2014/0284681 A1* | 9/2014 | Terada | H01L 29/42324 257/315 |
| 2015/0097236 A1* | 4/2015 | Tsai | H01L 29/7816 257/339 |

FOREIGN PATENT DOCUMENTS

TW 201238049 A1 9/2012
TW 201344908 A 11/2013

* cited by examiner

*Primary Examiner* — Khaja Ahmad
(74) *Attorney, Agent, or Firm* — Birch, Stewart, Kolasch & Birch, LLP

(57) ABSTRACT

A semiconductor structure is provided, which includes a first high-voltage MOS device region having a first well and a first light-doping region in a part of the first well, wherein the conductive type of the first well and the conductive type of the first light-doping region are opposite. The first high-voltage MOS device region also includes a first gate stack on a part of the first well and a part of the first light-doping region, and first heavy-doping regions in the first well and the first light-doping region at two sides of the gate stack, wherein the conductive type of the first heavy-doping region and the conductive type of the first well are the same. The first light-doping region between the first well and the first heavy-doping regions is a channel region of the first high-voltage MOS device region.

8 Claims, 5 Drawing Sheets

SEMICONDUCTOR STRUCTURE AND METHOD FOR MANUFACTURING THE SAME

BACKGROUND

Technical Field

The disclosure relates to a semiconductor structure, and in particular it relates to a semiconductor structure simultaneously including a low-voltage MOS device and a high-voltage MOS device and method for manufacturing the same.

Description of the Related Art

Manufacturers of electronic goods are under constant pressure to supply devices having expanded functionality and lower prices. One example is the cell phone, where staunch competition between manufacturers and re-sellers has kept cell phone prices down even as the cell phone functions have expanded dramatically. Indeed, a cell phone now includes such capabilities as e-mail, web-browsing, text-messaging, music storage, photography, and video playback.

In order to facilitate the trend towards expanded device functionality at lower prices, manufacturers must develop not only new processing architectures and algorithms, but also new semiconductor technologies allowing denser device integration at lower fabrication costs. However, increased device integration often requires a blending of heretofore incompatible technologies into a common device substrate.

Many electronic devices such as cell phones include low-voltage CMOS devices in various circuitry (e.g., data encryption and decryption). However, the same electronic devices also include relatively high-voltage devices in another circuitry (e.g., modulators/demodulators and power amplifiers). Unfortunately, high-voltage devices do not generally function effectively at low-voltages, and the low-voltage devices can be damaged by high voltages. These facts often result in the conventional provision of separate integrated circuits, one implemented in low-voltage devices and another implemented in high-voltage devices. However, such an approach to dealing with the common provision of different types of devices are simply not possible under emerging pressures related to integration densities and fabrication costs.

Many skills have been developed to overcome the problems described above. However, conventional skills have to change the doping concentrations of different doping regions while the driving voltage of the high-voltage device is changed. The difficulty and cost of changing the doping concentration is higher than designing new photo masks and corresponding doping region profiles. In other words, a structure including a high-voltage device and low-voltage device is usually suitable for specific high voltage and low voltage, which cannot be easily modified while changing the driving voltage of the product.

Accordingly, a novel process and a corresponding structure for fine-tuning the structure corresponding to different driving voltages (without increasing the number of photo masks or changing the doping concentration of the doping regions) are called for.

BRIEF SUMMARY

One embodiment of the disclosure provides a semiconductor structure, comprising: a first high-voltage MOS device region, including: a first well; a first light-doping region disposed in a part of the first well, wherein the conductive type of the first well and the conductive type of the first light-doping region are opposite; a first gate stack on a part of the first region and a part of the first light-doping region; and a plurality of first heavy-doping regions in the first well and the first light-doping region at two sides of the first gate stack, wherein the conductive type of the first heavy-doping regions and the conductive type of the first well are the same. The first light-doping region between the first well and the first heavy-doping region is a channel region of the first high-voltage MOS device region.

One embodiment of the disclosure provides a method of forming a semiconductor structure, comprising: forming a first well in a substrate; forming a first light-doping region in a part of the first well, wherein the conductive type of the first light-doping region and the conductive type of the first well are opposite; forming a first gate stack on a part of the first light-doping region and a part of the first well; implanting dopants to the first well and the first light-doping region that are not covered by the first gate stack to form a plurality of first heavy-doping regions at two sides of the first gate stack, wherein the conductive type of the first heavy-doping regions and the conductive type of the first well are the same; wherein the first light-doping region between the first well and the first heavy-doping region is a channel region of a high-voltage MOS device region.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
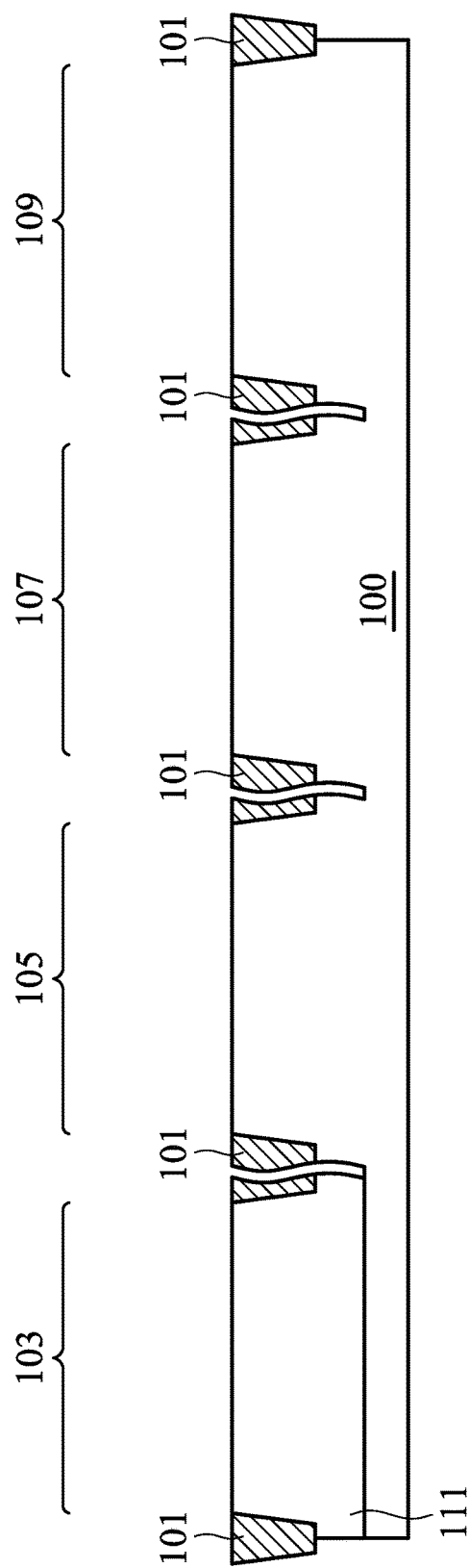
FIGS. 1, 2, 3, 4, and 5 are cross sections of a semiconductor structure during manufacture in one embodiment.

FIGS. 1 to 5 are cross sections of a semiconductor structure during manufacture in one embodiment. As shown in FIG. 1, a p-type substrate 100 is provided. The substrate 100 can be silicon substrate, a silicon-on-insulator (SOI) substrate, or the like. In one embodiment, a substrate 100 is provided, and then implanted by p-type dopants. Alternatively, the substrate 100 is formed by epitaxy growth and in-situ doped by the p-type dopants. In one embodiment, the substrate 100 has a doping concentration of 7e13 atoms/cm$^3$ to 7e15 atoms/cm$^3$.

Isolation structures 101 are then formed on the substrate 100 to separate and define a plurality of device regions, e.g. a p-type high-voltage MOS device region 103, a n-type high-voltage MOS device region 105, a p-type low-voltage MOS device region 107, and a n-type low-voltage MOS device region 109. A n-type deep well 111 is then formed in the high-voltage MOS device region 103. In one embodiment, the deep well 111 can be formed by but not be limited to following steps: forming a mask patter to cover the high-voltage MOS device region 105, the low-voltage MOS device region 107, and the low-voltage MOS device region 109 by lithography and etching processes; implanting n-type dopants to the high-voltage MOS device region 103 to define the deep well 111; and then removing the mask pattern. In one embodiment, the deep well 111 has a doping concentration of 5e14 atoms/cm$^3$ to 1e17 atoms/cm$^3$.

The isolation structures 101 in FIG. 1 are shallow trench isolation (STI), which can be formed by, (but is not limited to) the following steps: forming a mask layer on the substrate 100; patterning the mask layer to expose a part of the substrate 100 by lithography and etching processes; etching the exposed part of the substrate 100 to form trenches; filling the trenches with isolation material such as silica; and removing the patterned mask layer. Alternatively, the isolation structures 101 can be local oxidation of silicon (LOCOS), which can be formed by (but is not limited to) the following steps: depositing a mask layer such as silicon nitride layer on the substrate 100; patterning the mask layer to expose a part of the substrate 100 by lithography and etching processes; thermally oxidizing the exposed part of the substrate 100 to form a silica layer; and removing the patterned mask layer. The above silica layer is the LOCOS.

Figure 2:
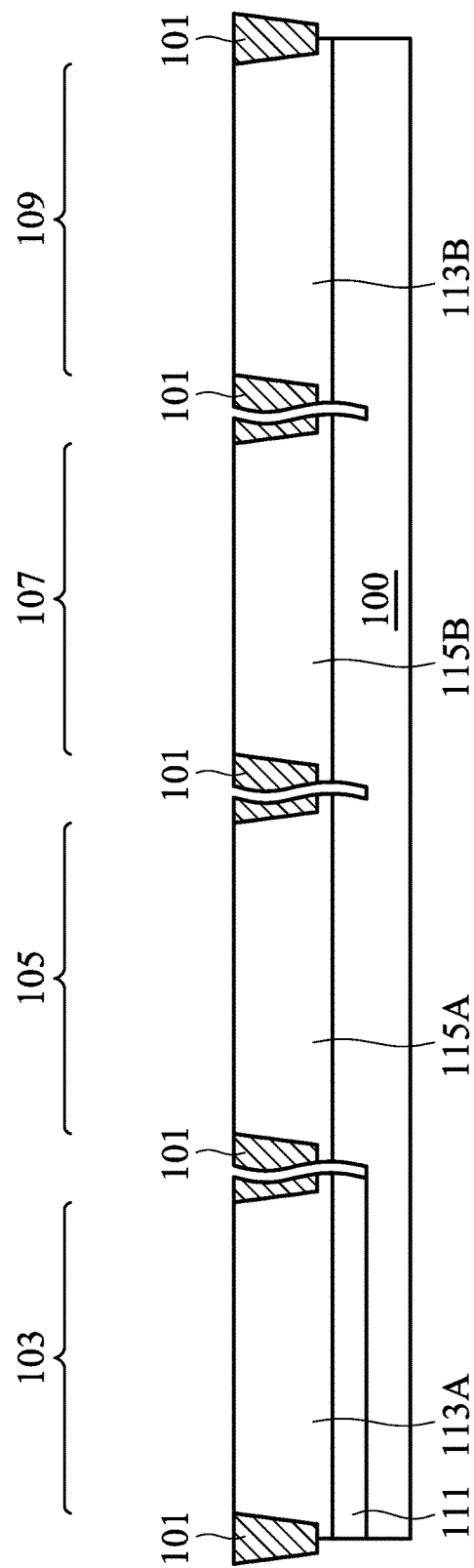

As shown in FIG. 2, p-type wells 113A and 113B are formed in the high-voltage MOS device region 103 and the low-voltage MOS device region 109, respectively. N-type wells 115A and 115B are formed in the high-voltage MOS device region 105 and the low-voltage MOS device region 107, respectively. In one embodiment, the wells 113A and 113B can be formed by (but is not limited to) the following steps: forming a mask pattern (not shown) to cover the high-voltage MOS device region 105 and the low-voltage MOS device region 107 by lithography and etching processes; implanting p-type dopants to the high-voltage MOS device region 103 and the low-voltage MOS device region 109 to define the wells 113A and 113B; and then removing the mask pattern. In one embodiment, the wells 113A and 113B have the same doping concentration of 1e15 atoms/cm$^3$ to 1e17 atoms/cm$^3$. As shown in FIG. 2, the wells 113A and 113B have the same depth, and the well 113A has a shallower depth than that of the deep well 111, thereby avoiding a leakage current problem resulted from the same conductive type of the well 113A and the substrate 100. In one embodiment, the wells 115A and 115B can be formed by (but is not limited to) the following steps: forming a mask pattern (not shown) to cover the high-voltage MOS device region 103 and the low-voltage MOS device region 109 by lithography and etching processes; implanting n-type dopants to the high-voltage MOS device region 105 and the low-voltage MOS device region 107 to define the wells 115A and 115B; and then removing the mask pattern. In one embodiment, the wells 115A and 115B have the same doping concentration of 1e15 atoms/cm$^3$ to 1e17 atoms/cm$^3$. As shown in FIG. 2, the wells 115A and 115B have the same depth. Although the wells 113A/113B and the wells 115A/115B have the same depth in FIG. 2, but the wells 113A/113B and the wells 115A/115B may have different depths if necessary. In one embodiment, the wells 113A and 113B can be formed before forming the wells 115A and 115B. Alternatively, the wells 115A and 115B are formed before forming the wells 113A and 113B.

Figure 3:
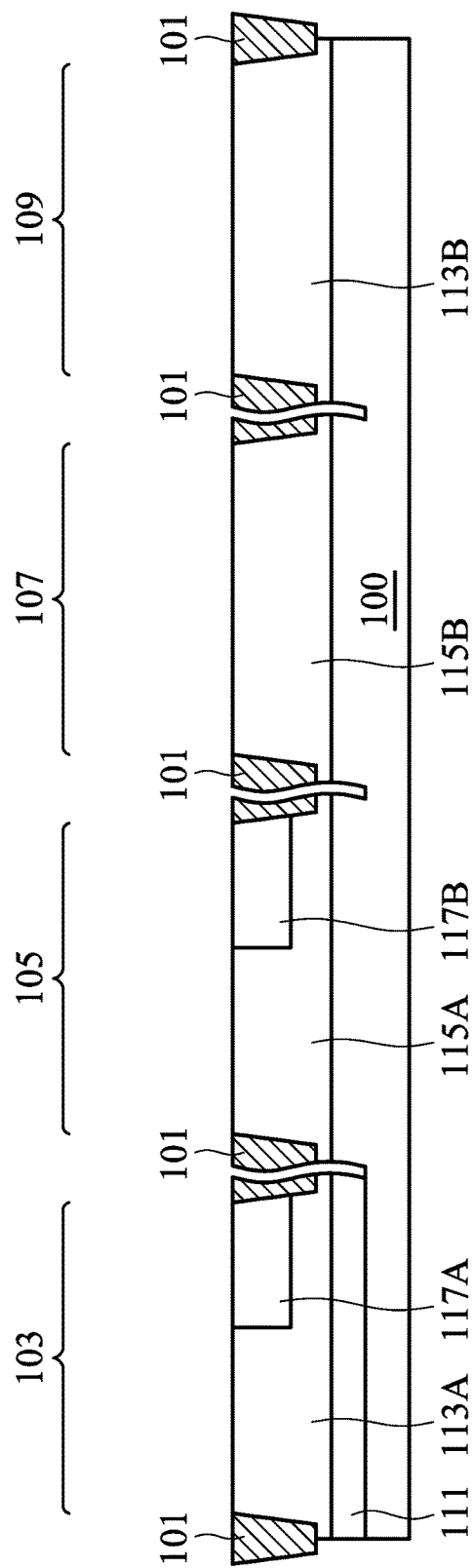

As shown in FIG. 3, n-type light-doping region 117A is formed in a part of the well 113A, and a p-type light-doping region 117B is formed in a part of the well 113B. In one embodiment, the light-doping region 117A can be formed by (but is not limited to) the followings steps: forming a mask pattern (not shown) to cover a part of the high-voltage MOS device region 103, the high-voltage MOS device region 105, the low-voltage MOS device region 107, and the low-voltage MOS device region 109; implanting n-type dopants into a part of the well 113A to define the light-doping region 117A; and removing the mask pattern. In one embodiment, the light-doping region 117A has a doping concentration of 1e15 atoms/cm$^3$ to 5e17 atoms/cm$^3$. As shown in FIG. 3, the light-doping region 117A has a shallower depth than that of the well 113A. In one embodiment, the light-doping region 117B can be formed by (but is not limited to) the followings steps: forming a mask pattern (not shown) to cover the high-voltage MOS device region 103, a part of the high-voltage MOS device region 105, the low-voltage MOS device region 107, and the low-voltage MOS device region 109; implanting p-type dopants into a part of the well 115A to define the light-doping region 117B; and removing the mask pattern. In one embodiment, the light-doping region 117B has a doping concentration of 1e15 atoms/cm$^3$ to 5e17 atoms/cm$^3$. As shown in FIG. 3, the light-doping region 117B has a shallower depth than that of the well 115A. Although the light-doping region 117A and the light-doping region 117B have the same depth in FIG. 3, the light-doping region 117A and the light-doping region 117B may have different depths if necessary. In one embodiment, the light-doping region 117A is formed before forming the light-doping region 117B. Alternatively, the light-doping region 117B is formed before forming the light-doping region 117A.

Figure 4:
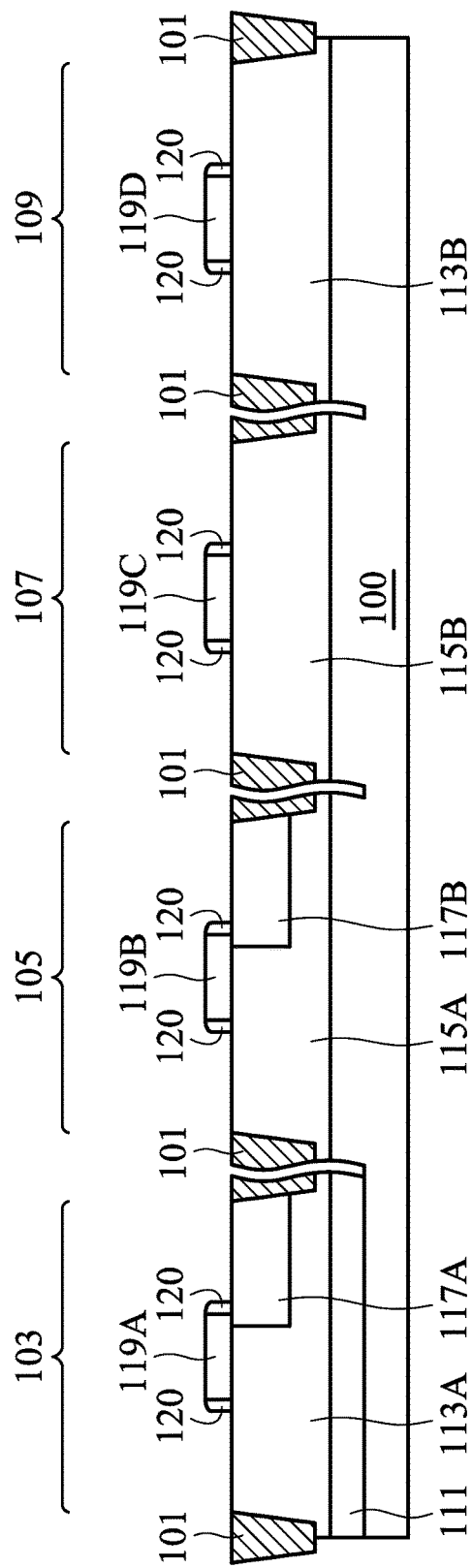

As shown in FIG. 4, gate stacks 119A, 119B, 119C, and 119D are then formed over the high-voltage MOS device region 103, the high-voltage MOS device region 105, the low-voltage MOS device region 107, and the low-voltage MOS device region 109, respectively. The gate stack 119A covers a part of the well 113A and a part of the light-doping region 117A, and the gate stack 119B covers a part of the well 115A and a part of the light-doping region 117B. In one embodiment, the gate stacks 119A, 119B, 119C, and 119D can be formed by (but is not limited to) the following steps: forming a gate dielectric layer on the structure in FIG. 3; forming a gate electrode layer on the gate dielectric layer; forming a mask pattern (not shown) to cover a part of the gate electrode layer by lithography and etching processes; and then removing the gate electrode layer (not covered by the mask pattern) and the underlying gate dielectric layer to define the gate stacks 119A, 119B, 119C, and 119D. In one embodiment, the gate dielectric layer can be composed of SiO$_2$ silicon oxide, silicon nitride, silicon oxynitride, high-k material, any other suitable dielectric material, or a combination thereof, and the gate electrode layer can be composed of amorphous silicon, poly-silicon, one or more metal, metal nitride, conductive metal oxide, or a combination thereof. Optionally, spacers 120 can be formed on sidewalls of the gate stacks 119A, 119B, 119C, and 119D. In one embodiment, the spacers 120 can be formed by (but is not limited to) the following steps: forming a spacer layer on the gate stacks and the exposed doping regions; and then removing a part of the spacer layer by anisotropic etching to keep the spacers 120 on the sidewalls of the gate stacks. The spacer layer can be silica, silicon nitride, silicon oxynitride, or a multi-layered structure thereof. Alternatively, the spacers 120 can be omitted.

Note that the order of FIGS. 3 and 4 can be reversed, such that the gate stacks are formed before forming the light-doping regions 117A and 117B. If the gate stacks are formed earlier, the spacers 120 must be formed after forming the light-doping regions 117A and the 117B, such that the subsequently formed heavy-doping region 121A and the well 113A (or the heavy doping region 123A and the well 115A) are separated by the light-doping region 117A (or 117B).

Figure 5:
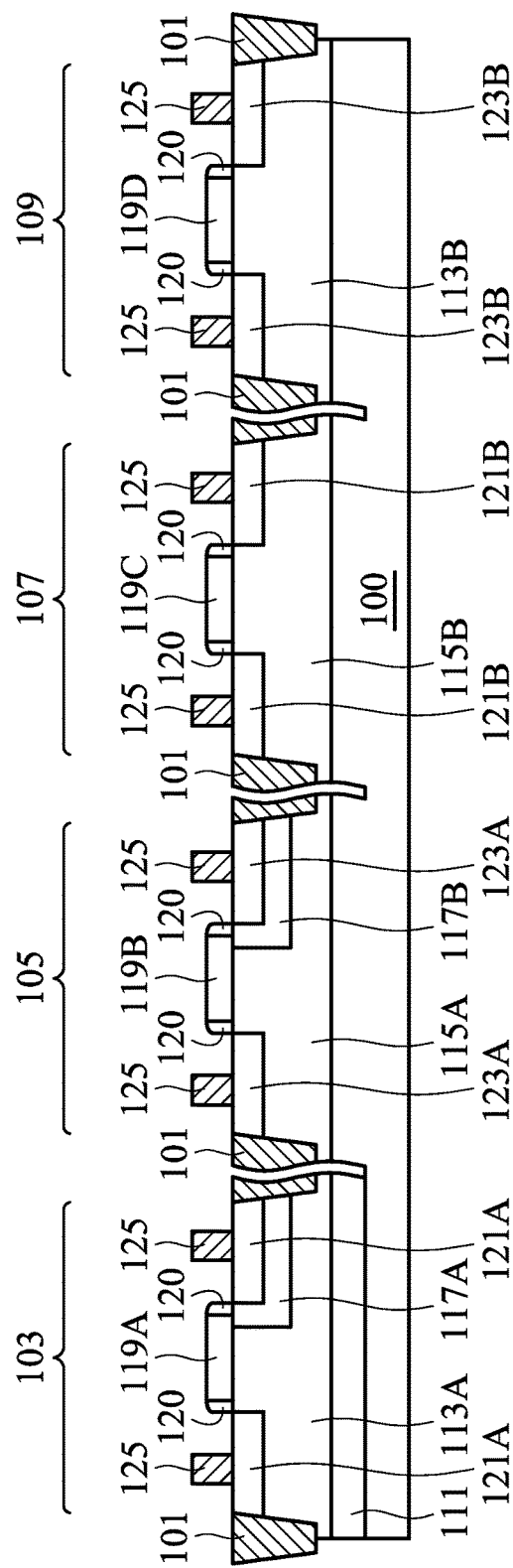

As shown in FIG. 5, p-type heavy-doping regions 121A are formed in the well 113A and the light-doping region 117A at two sides of the gate stack 119A, n-type heavy-doping regions 123A are formed in the well 115A and the light-doping region 117B at two sides of the gate stack 119B, p-type heavy-doping regions 121B are formed in the well 115B at two sides of the gate stack 119C, and n-type heavy-doping regions 123B are formed in the well 113B at two sides of the gate stack 119D. In one embodiment, the heavy doping regions 121A and 121B can be formed by (but is not limited to) the following steps: forming a mask pattern (not shown) to cover the high-voltage MOS device region 105 and the low-voltage MOS device region 109 by lithography and etching processes; and implanting p-dopants to the high-voltage MOS device region 103 and the low-voltage MOS device region 107 not covered by the gate stacks 119A and 119C for defining heavy-doping regions 121A and 121B, and removing the mask pattern. In one embodiment, the heavy doping regions 121A and 121B have the same doping concentration of 5e17 atoms/cm$^3$ to 2e20 atoms/cm$^3$. As shown in FIG. 5, the heavy doping regions 121A and 121B have the same doping depths, and the heavy-doping region 121A has a shallower depth than that of the light-doping region 117A. The n-type light-doping region 117A disposed between the p-type well 113A and the right sided heavy-doping region 121A is a channel region of the high-voltage MOS device region 103. In the above structure, the thickness of the spacers 120 in FIG. 4 can be changed to adjust the width of the light-doping region 117A that is covered by the gate stack 119A and the spacer 120. As such, the structures in FIGS. 1 to 5 can be completed by same photo masks and same implanting processes, and the channel length of the high-voltage MOS device region 103 and corresponding driving voltage can be easily adjusted by changing the thickness of the spacers 120.

In one embodiment, the heavy doping regions 123A and 123B can be formed by (but is not limited to) the following steps: forming a mask pattern (not shown) to cover the high-voltage MOS device region 103 and the low-voltage MOS device region 107 by lithography and etching processes; and implanting n-dopants to the high-voltage MOS device region 105 and the low-voltage MOS device region 109 not covered by the gate stacks 119B and 119D for defining heavy-doping regions 123A and 123B, and removing the mask pattern. In one embodiment, the heavy doping regions 123A and 123B have the same doping concentration of 1e17 atoms/cm$^3$ to 5e19 atoms/cm$^3$. As shown in FIG. 5, the heavy doping regions 123A and 123B have the same doping depths, and the heavy-doping region 123A has a shallower depth than that of the light-doping region 117B. The p-type light-doping region 117B disposed between the n-type well 115A and the right sided heavy-doping region 123A is a channel region of the high-voltage MOS device region 105. In the above structure, the thickness of the spacers 120 in FIG. 4 can be changed to adjust the width of the light-doping region 117B that is covered by the gate stack 119B and the spacer 120. As such, the structures in FIGS. 1 to 5 can be completed by same photo masks and same implanting processes, and the channel length of the high-voltage MOS device region 105 and corresponding driving voltage can be easily adjusted by changing the thickness of the spacers 120. In other words, the driving voltage of the high-voltage MOS device region can be easily adjusted without changing the doping concentration of the doping region or changing the photo mask design.

The n-type well 115B between the p-type heavy-doping regions 121B is a channel region of the low-voltage MOS device region 107. The p-type well 113B between the n-type heavy-doping regions 123B is a channel region of the low-voltage MOS device region 109. It should be understood that the heavy-doping regions 121A at two sides of the gate stack 119A are source/drain regions of the high-voltage MOS device region 103, the heavy-doping regions 123A at two sides of the gate stack 119B are source/drain regions of the high-voltage MOS device region 105, the heavy-doping regions 121B at two sides of the gate stack 119C are source/drain regions of the low-voltage MOS device region 107, and the heavy-doping regions 123B at two sides of the gate stack 119D are source/drain regions of the low-voltage MOS device region 109. An ILD (not shown) can then be formed on the above structure, and contacts 125 can then be formed to penetrate the ILD for contacting the heavy-doping regions 121A, 121B, 123A, and 123B.

In the above embodiment, the substrate 100, the high-voltage MOS device region 103, the low-voltage MOS device 107, the wells 113A and 113B, the light-doping region 117B, and the heavy-doping regions 121A and 121B are p-type; and the high-voltage MOS device region 105, the low-voltage MOS device region 109, the deep well 111, the wells 115A and 115B, the light-doping region 117A, and the heavy doping regions 123A and 123B are n-type. Alternatively, the substrate 100, the high-voltage MOS device region 103, the low-voltage MOS device 107, the wells 113A and 113B, the light-doping region 117B, and the heavy-doping regions 121A and 121B are n-type; and the high-voltage MOS device region 105, the low-voltage MOS device region 109, the deep well 111, the wells 115A and 115B, the light-doping region 117A, and the heavy doping regions 123A and 123B are p-type. It should be understood that the n-type dopants can be phosphorus, arsenic or antimony, and the p-type dopants can be boron or BF$_2$.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
   a first high-voltage MOS device region, including:
   a first well;
   a first light-doping region disposed in a part of the first well, wherein a conductive type of the first well and a conductive type of the first light-doping region are opposite;
   a first gate stack on a part of the first well and a part of the first light-doping region;
   spacers on sidewalls of the first gate stack; and
   a plurality of first heavy-doping regions in the first well and the first light-doping region at two sides of the first gate stack, wherein a conductive type of the plurality of the first heavy-doping regions and the conductive type of the first well are the same, and each of the plurality of the first heavy-doping regions has an edge aligning to an outer side of the spacers;
   wherein the first light-doping region between the first well and one of the plurality of the first heavy-doping regions in the first light-doping region is a channel region of the first high-voltage MOS device region, and
   wherein the first well is disposed in a substrate, the conductive type of the first well and a conductive type of the substrate are the same, and the first high-voltage MOS device region further includes a deep well disposed between the first well and the substrate, and a conductive type of the deep well and the conductive type of the first well are different.

2. The semiconductor structure as claimed in claim 1, wherein the first well is disposed in a substrate, and the conductive type of the first well and a conductive type of the substrate are opposite.

3. The semiconductor structure as claimed in claim 1, further comprising:
 a first low-voltage MOS device region, including:
 a second well, wherein the conductive type of the first well and a conductive type of the second well are opposite;
 a second gate stack on a part of the second well; and
 a plurality of second heavy-doping regions in the second well at two sides of the second gate stack, and a conductive type of the plurality of the second heavy-doping regions and the conductive type of the second well are opposite,
 wherein the second well between the plurality of the second heavy-doping regions is a channel region of the first low-voltage MOS device region,
 wherein the plurality of the first heavy-doping regions and the second plurality of the heavy-doping regions have the same depth and the same doping concentration.

4. The semiconductor structure as claimed in claim 1, further comprising:
 a second high-voltage MOS device, including:
 a second well, wherein a conductive type of the second well and the conductive type of the first well are opposite;
 a second light-doping region in a part of the second well, wherein the conductive type of the second well and a conductive type of the second light-doping region are opposite;
 a second gate stack on a part of the second well and a part of the second light-doping region;
 a plurality of heavy-doping regions in the second well and the second light-doping region at two sides of the second gate stack, wherein a conductive type of the plurality of the heavy-doping regions and the conductive type of the second well are the same;
 wherein the second light-doping region between the second well and the second heavy-doping region is a channel region of the second high-voltage MOS device.

5. A method of forming a semiconductor structure, the semiconductor structure comprising:
 a first high-voltage MOS device region, including:
 a first well;
 a first light-doping region disposed in a part of the first well, wherein a conductive type of the first well and a conductive type of the first light-doping region are opposite;
 a first gate stack on a part of the first well and a part of the first light-doping region;
 spacers on sidewalls of the first gate stack; and
 a plurality of first heavy-doping regions in the first well and the first light-doping region at two sides of the first gate stack, wherein a conductive type of the plurality of the first heavy-doping regions and the conductive type of the first well are the same, and each of the plurality of the first heavy-doping regions has an edge aligning to an outer side of the spacers;
 wherein the first light-doping region between the first well and one of the plurality of the first heavy-doping regions in the first light-doping region is a channel region of the first high-voltage MOS device region, and
 wherein the first well is disposed in a substrate, the conductive type of the first well and a conductive type of the substrate are the same, and the first high-voltage MOS device region further includes a deep well disposed between the first well and the substrate, and a conductive type of the deep well and the conductive type of the first well are different,
 the method comprising:
 forming the first well in the substrate;
 forming the first light-doping region in the part of the first well;
 forming the first gate stack on the part of the first light-doping region and the part of the first well;
 implanting dopants to the first well and the first light-doping region that are not covered by the first gate stack to form the plurality of first heavy-doping regions at the two sides of the first gate stack.

6. The method as claimed in claim 5, wherein
 the step of forming the first well also forms a second well of a low-voltage MOS device region;
 the step of forming the first gate stack also forms a second gate stack of the low-voltage MOS device region; and
 the step of forming the plurality of the first heavy-doping regions also forms a plurality of second heavy-doping regions of the low-voltage MOS device region,
 wherein the second well between the plurality of the second heavy-doping regions is a channel region of the low-voltage MOS device region.

7. The method as claimed in claim 5, further comprising:
 forming the deep well between the first well and the substrate.

8. The method as claimed in claim 5, further comprising:
 forming the spacers on the sidewalls of the first gate stack.

* * * * *